(12) United States Patent
Fujioka et al.

(10) Patent No.: US 11,778,793 B2
(45) Date of Patent: Oct. 3, 2023

(54) SYSTEMS INCLUDING AN INTEGRATED POWER MODULE WITH VIAS AND METHODS OF FORMING THE SAME

(71) Applicant: Toyota Motor Engineering & Manufacturing North America, Inc., Plano, TX (US)

(72) Inventors: Hitoshi Fujioka, Ann Arbor, MI (US); Shailesh N. Joshi, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 112 days.

(21) Appl. No.: 17/218,897

(22) Filed: Mar. 31, 2021

(65) Prior Publication Data

US 2022/0322582 A1    Oct. 6, 2022

(51) Int. Cl.
  H05K 7/20    (2006.01)
  H05K 1/11    (2006.01)
  (Continued)

(52) U.S. Cl.
  CPC ........ *H05K 7/20936* (2013.01); *H02M 7/003* (2013.01); *H05K 1/0209* (2013.01);
  (Continued)

(58) Field of Classification Search
  CPC ..... H05K 1/0201; H05K 1/0203–0204; H05K 1/0209; H05K 1/0272; H05K 1/116; H05K 3/341; H05K 7/20; H05K 7/2029; H05K 7/20309–20327; H05K 7/2039; H05K 7/208; H05K 7/20872; H05K 7/2089; H05K 7/20254–20272; H05K 7/20663; H05K 7/20881; H05K 7/20927; H05K 7/20936; H05K 7/2099; H05K 2201/064; H05K 2201/066; H05K 2201/10015; H05K 2201/10166; H05K 2201/10674;
  (Continued)

(56) References Cited

U.S. PATENT DOCUMENTS

| | | | |
|---|---|---|---|
| 7,641,490 B2 * | 1/2010 | Korich | B60L 3/003 439/196 |
| 9,257,825 B2 | 2/2016 | Kalayjian et al. | |

(Continued)

FOREIGN PATENT DOCUMENTS

| | | | | |
|---|---|---|---|---|
| CN | 204103780 U | | 1/2015 | |
| CN | 105450042 A | | 3/2016 | |
| DE | 19720695 A1 | * | 11/1998 | ........... H01L 25/162 |

OTHER PUBLICATIONS

DE-19720695-A1 English Translation (Year: 1998).*

*Primary Examiner* — Amir A Jalali
(74) *Attorney, Agent, or Firm* — Dinsmore & Shohl LLP

(57) ABSTRACT

A system includes a power device unit coupled to a substrate. An upper cooling assembly is thermally coupled to an upper side of the substrate. A lower cooling assembly is thermally coupled to a lower side of the substrate. A gate driver unit is coupled to the upper cooling assembly. At least one upper via is formed through the upper cooling electrically coupling the gate driver unit to the power device unit. A capacitor unit is coupled to the lower cooling assembly. At least one lower via formed through the lower cooling assembly electrically coupling the capacitor unit to the power device unit.

20 Claims, 12 Drawing Sheets

(51) Int. Cl.
*H05K 1/02* (2006.01)
*H05K 3/34* (2006.01)
*H02M 7/00* (2006.01)

(52) U.S. Cl.
CPC ............. *H05K 1/116* (2013.01); *H05K 3/341* (2013.01); *H05K 2201/10015* (2013.01); *H05K 2201/10166* (2013.01)

(58) Field of Classification Search
CPC . H01L 23/3121; H01L 23/427; H01L 23/473; H01L 23/34; H01L 29/00; H01H 9/52; F28D 15/00; F28D 15/0266–0275; F28D 9/00; H02M 1/08; H02M 1/44; H02M 7/003; H02M 7/5387
See application file for complete search history.

(56) References Cited

U.S. PATENT DOCUMENTS

| | | | |
|---|---|---|---|
| 9,831,799 | B2 | 11/2017 | Shinohara et al. |
| 9,961,758 | B1 | 5/2018 | Pickering |
| 10,720,852 | B1* | 7/2020 | Soles ................. H05K 7/20872 |
| 10,867,980 | B2* | 12/2020 | Hori ........................ H01L 23/42 |
| 2008/0225482 | A1* | 9/2008 | Smith ................. H01L 23/4735 361/699 |
| 2009/0154101 | A1* | 6/2009 | Korich ................. H02M 7/003 361/689 |
| 2014/0077611 | A1 | 3/2014 | Young et al. |
| 2017/0341638 | A1* | 11/2017 | Sawada .................. H05K 7/209 |
| 2019/0014654 | A1* | 1/2019 | Kobayashi ........... H05K 7/1427 |
| 2019/0045635 | A1* | 2/2019 | Chin .................... H05K 7/1432 |
| 2020/0132392 | A1* | 4/2020 | Joshi .................... H05K 7/2039 |
| 2021/0328482 | A1* | 10/2021 | Rutowski ............. H02K 11/215 |
| 2022/0142017 | A1* | 5/2022 | Zhou ................. H05K 7/20318 361/700 |

\* cited by examiner

SYSTEMS INCLUDING AN INTEGRATED POWER MODULE WITH VIAS AND METHODS OF FORMING THE SAME

TECHNICAL FIELD

The present disclosure generally relates to an inverter including a power module and, more specifically, to an integrated inverter including a power module with cooling assemblies and vias formed through the cooling assemblies.

BACKGROUND

Power control units include power devices, gate drivers, and capacitors. The power devices may be switched on and off in high frequency during operation of a vehicle, for example. These power devices may generate significant amounts of heat. Some traditional systems include cooling units to regulate temperature while the power devices switch on and off. Furthermore, the power devices are connected to the driver board through pin connections and may extend a distance from the driver board, leading to a larger volume profile, which includes a small power density and a high system loop inductance, resulting in a high power loss, especially at high switching frequencies. Improvements within the structure of an inverter are desirable to improve the power density, improve the profile size, and improve thermal management.

SUMMARY

In one aspect, a system includes a power device unit coupled to a substrate. The system further includes an upper cooling assembly thermally coupled to an upper side of the substrate and a lower cooling assembly thermally coupled to a lower side of the substrate. A gate driver unit is coupled to the upper cooling assembly. At least one upper via is formed through the upper cooling electrically coupling the gate driver unit to the power device unit. A capacitor unit is coupled to the lower cooling assembly. At least one lower via is formed through the lower cooling assembly electrically coupling the capacitor unit to the power device unit.

In another aspect, a method includes soldering a power device unit to a substrate, coupling an upper cooling assembly above the substrate, the upper cooling assembly including at least one upper via, coupling a lower cooling assembly below the substrate, the lower cooling assembly including at least one lower via, electrically coupling the power device unit to a gate driver unit through the at least one upper via and electrically coupling the power device unit to a capacitor unit through the at least one lower via. Soldering the power device unit to the substrate can include directly bonding a plurality of power devices to input and output busbars of the substrate. Further, the method can include forming an upper insulation layer between the upper cooling assembly and an upper side of the substrate, and forming a lower insulation layer between the lower cooling assembly and a lower side of the substrate.

In another aspect, disclosed is a system including a power device unit is coupled to a substrate. An upper cooling assembly thermally is coupled to an upper side of the substrate and includes at least one via pathway. At least one upper via is disposed within the at least one via pathway of the upper cooling assembly. A lower cooling assembly thermally is coupled to a lower side of the substrate and includes at least one via pathway. A plurality of lower vias are disposed within the at least one via pathway of the lower cooling assembly. A gate driver unit is coupled to the upper cooling assembly and is electrically coupled to the power device unit by the at least one upper via. A capacitor unit is coupled to the lower cooling assembly and is electrically coupled to the power device unit by the plurality of lower vias.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
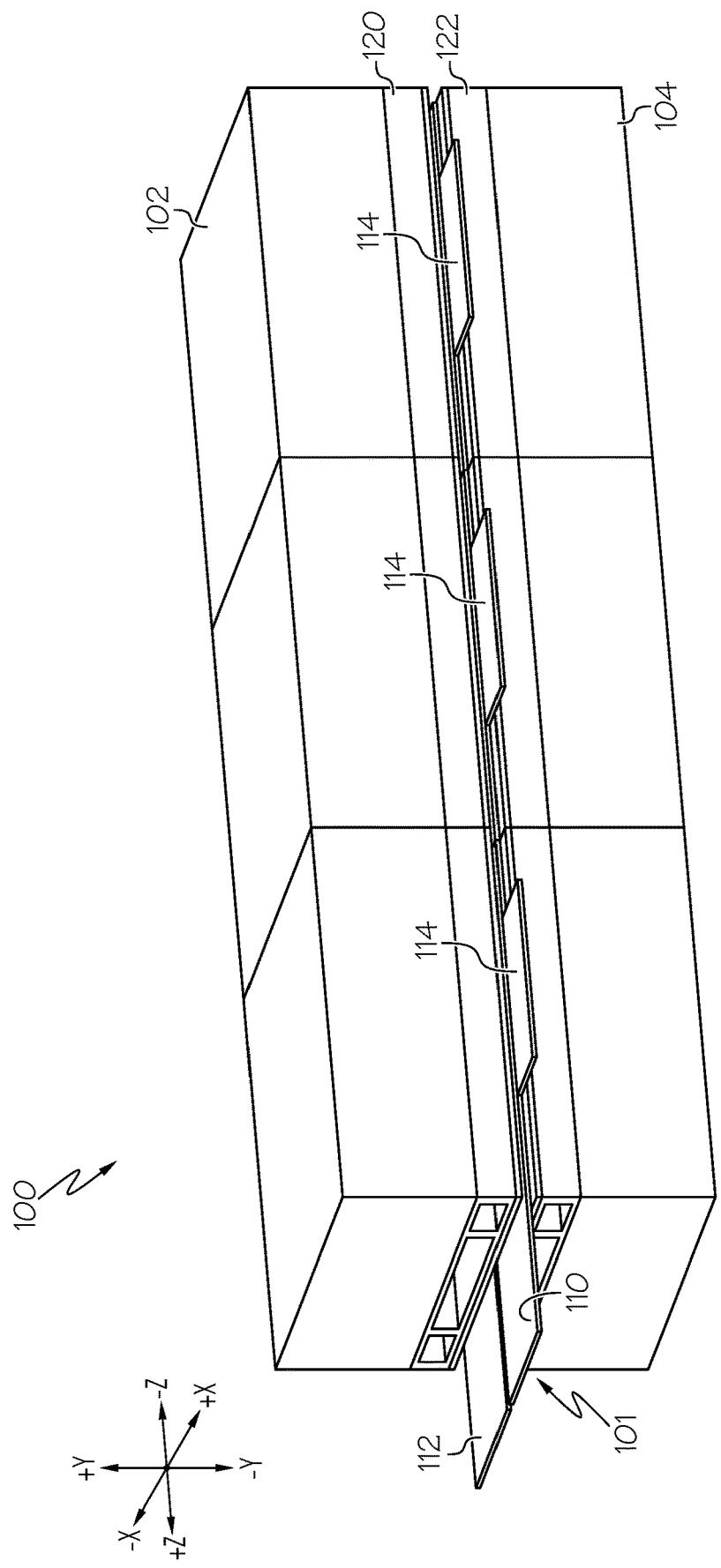
FIG. 1 schematically depicts a side view of an inverter including a printed circuit board (PCB) disposed between an upper cooling assembly and a lower cooling assembly according to one or more embodiments shown and described herein.

The devices described herein generally relate to an integrated inverter that includes a power device unit (e.g., one or more power semiconductors) coupled to a substrate of a PCB, an upper cooling assembly thermally coupled to an upper side of the substrate and lower cooling assembly thermally coupled to the lower side of the substrate. In embodiments, the inverter may include a gate driver unit and a capacitor unit. The gate driver unit may be coupled to the upper cooling assembly. At least one upper via may be formed through the upper cooling assembly to electrically couple the gate driver to the power device unit. Similarly, the capacitor unit may be coupled to the lower cooling assembly and at least one lower via may be formed through the lower cooling assembly to electrically couple the capacitor unit to the power device unit. Embodiments of the present disclosure may reduce the size of an inverter in comparison to traditional converters by, for example, employing the structures and arraignments described herein. For instance, example integrated inverters may combine power device units, gate driver units and capacitor units into a single package.

Traditional inverters utilize power devices (e.g., insulated gate bipolar transistor (IGBT), silicon carbide (SiC), or other switching devices) separated from the gate driver units and capacitors units used to control the operation of power electronic devices. Traditionally, the gate driver units and capacitors units have been separated from the power devices at least because of the high amounts of heat generated by the power devices. Separation of these units results in a large package volume and causes high parasitic inductance. In vehicles, for example, the size of these traditional inverters impact constraints on other systems and may limit available dimensions for vehicles or components of vehicles. The embodiments disclosed herein may solve or improve upon the above as well as other aspects as may be apparent herein.

The cooling assemblies and other components described herein may regulate or otherwise manage heat generated by the power device unit utilized in the integrated inverters. In examples, cooling assemblies may utilize boiling and low power passives using single phase cooling within a pumped loop. In embodiments, input and output busbars may be coupled to the power device unit, capacitor unit, and the gate driver unit. Vias may be formed through cooling structures to electrically couple the power device unit (e.g., via the input and output busbars) to the capacitor unit, and the gate driver unit. Furthermore, these embodiments may reduce parasitic inductance relative to tradition inverters at least by locating the gate driver unit and/or capacitor unit closer to the power device unit, and/or providing vias through cooling assemblies bonding. Accordingly, embodiments may include compact and integrated inverters that may include a reduce size relative to tradition inverters, while providing appropriate power controls, such as power controls for a vehicle.

As shown and described herein, new implementations of an inverter within cooling assemblies, a power device unit coupled to a substrate, and vias formed through cooling assemblies are provided. Turning now to the drawings wherein like numbers refer to like structures, and particularly to FIG. 1, schematically depicts a side view of an inverter 100 including a major axis (e.g., +Y—-Y axis), a PCB 101 disposed between an upper cooling assembly 120 and a lower cooling assembly 122. The inverter 100 may further include a gate driver unit 102 and a capacitor unit 104. The gate driver unit 102 may be coupled to the upper cooling assembly 120 through mechanical fasteners, adhesives, molding, bonding, or the like. The capacitor unit 104 may be coupled to the lower cooling assembly 122 through mechanical fasteners, adhesives, molding, bonding, or the like. As such, the upper cooling assembly 120 and the lower cooling assembly 122 may respectively regulate or otherwise manage thermal energy produced by the power device unit 170 (FIG. 2), the gate driver unit 102, and the capacitor unit 104.

The PCB 101 may include a substrate including one or more layers. For instance, the PCB 101 may include substrates that include one or more output busbar 114, input busbar 110 (e.g., a positive busbar) and input busbar 112 (e.g., a negative busbar). In examples, the output busbar 114, input busbar 110 (e.g., a positive busbar) and input busbar 112 (e.g., a negative busbar) may include a multi-layer PCB stack with an embedded power device unit (e.g., plurality of embedded power devices which may function independently or as a unit). In general, the PCB 101 may include one or more substrate layers such as copper, gold, silver, aluminum, an alloy thereof, other thermally and/or electrically conductive materials, and/or other layers. The layers may be laminated together. Processes such as etching, milling, laser drilling, and the like may be implemented to create electrical connections within a substrate layer, vias between substrate layers, physical features, or the like. It is further noted that the inverter 100 may include different numbers of busbars, layers, or the like.

Capacitor unit 104 is disposed on a first side (e.g., a major side) of the PCB substrates (e.g., output busbar 114, input busbar 110, and input busbar 112). In an example, the capacitor unit 104 may be disposed on a bottom or lower side of the substrate and in the −Y direction of the +Y—-Y axis (e.g., below) the lower cooling assembly 122. The capacitor unit 104 may include one or more capacitor cells that may be disposed on a board, housed within a housing, supported by support structures, or the like. In addition, the capacitor unit 104 may include capacitor terminals having appropriate shapes, insulating layers, desired capacitances, or the like. As described here and elsewhere in this disclosure, the output busbar 114, input busbar 110, and input busbar 112 may be connected to the capacitor unit 104 with one or more vias (not shown in FIG. 1) formed through the lower cooling assembly 122.

Figure 2:
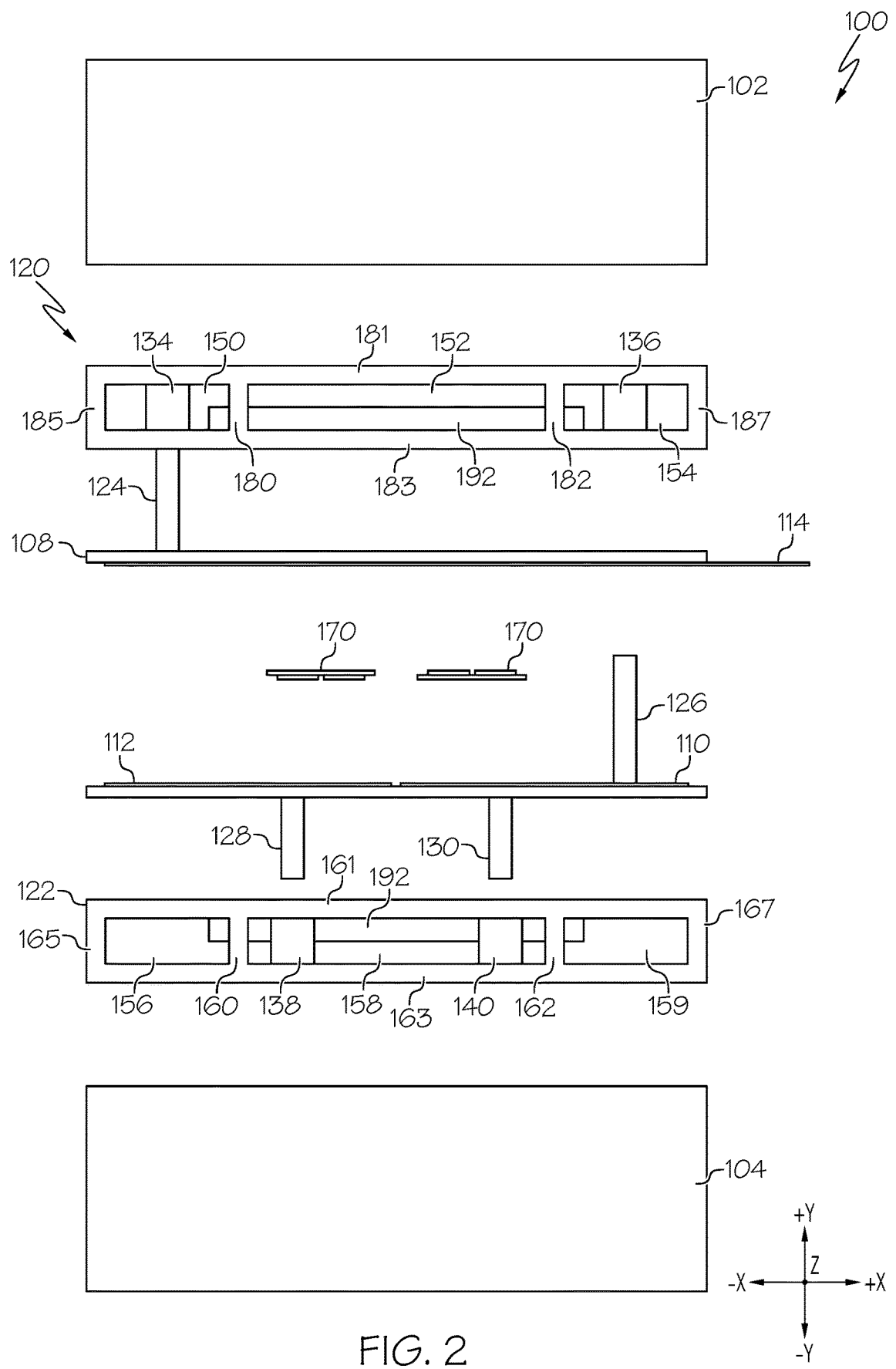
FIG. 2 depicts an exploded view of the inverter of FIG. 1 including vias through the upper cooling assembly and vias through the lower cooling assembly according to one or more embodiments shown and described herein.

The gate driver unit 102 is disposed on a second side (e.g., a second major side) of the PCB substrates (e.g., output busbar 114, input busbar 110, and input busbar 112). In an example, the gate driver unit 102 may be disposed on a top or upper side of the substrate, such as an upper side of the upper cooling assembly 120 in the +Y direction of the +Y—-Y axis (e.g., above). In embodiments, the gate driver unit 102 may include electronic components (e.g., gate drivers, power amplifiers, etc.) to control the power device unit 170 (FIG. 2). For instance, the gate driver unit 102 may receive low-power input from a source (e.g., a controller or the like) and may generate a high-current drive input for the power device unit 170. The gate driver unit 102 may include one or more electronic components that may be communicatively coupled, disposed on an integrated circuit board, housed within a housing, supported by support structures, or the like. As described here and elsewhere in this disclosure, the gate driver unit 102 may be electrically connected to gate terminals (not shown in FIG. 1) of a power device unit 170 through one or more vias (not shown in FIG. 1) formed through the upper cooling assembly 120. In an example, the inverter 100 may include two parallel devices and a three phase inverter. According to embodiments, different numbers of parallel devices may be utilized depending on described output.

Figure 3:
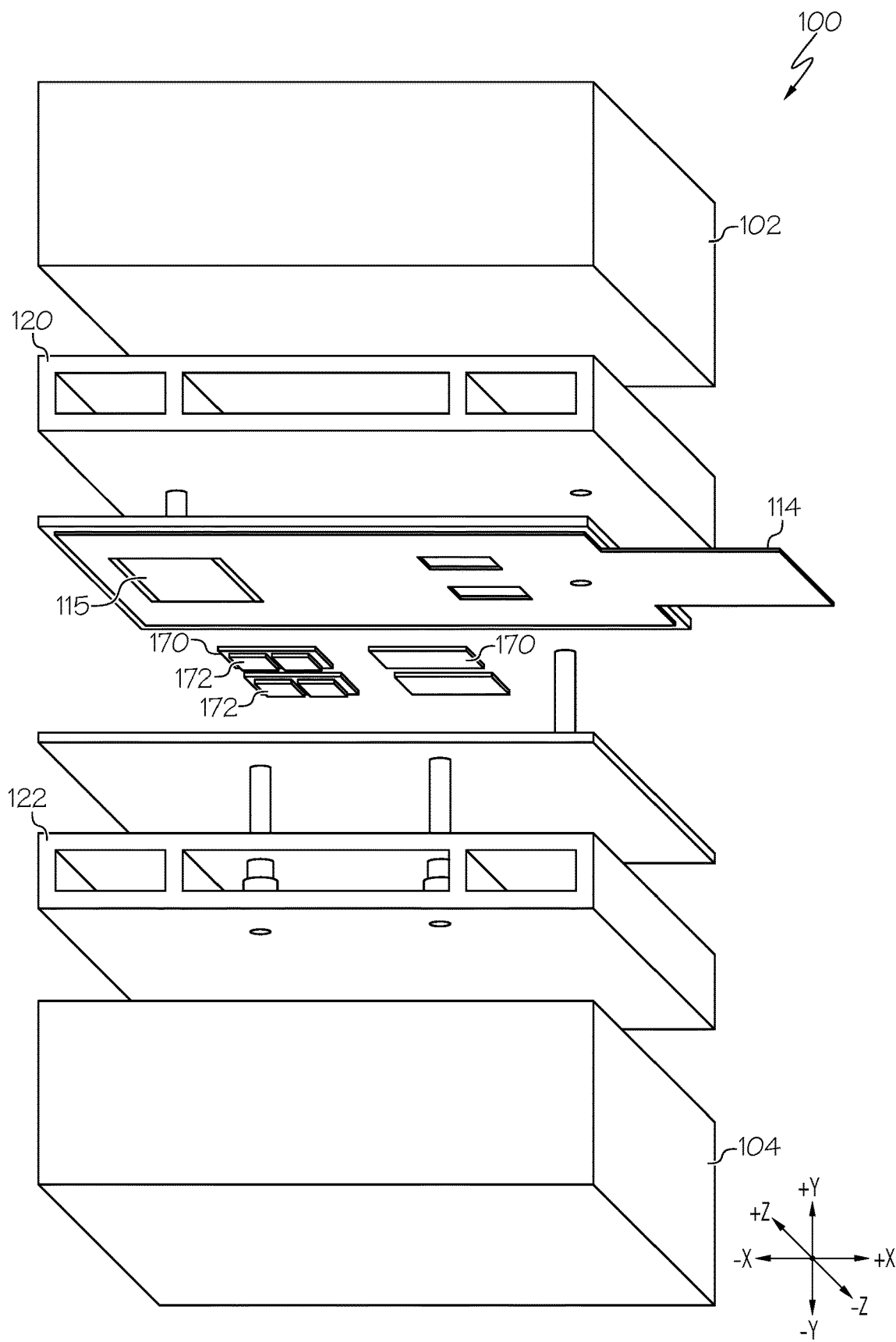
FIG. 3 depicts a bottom perspective exploded view of the inverter of FIG. 1 including vias through the upper cooling assembly and vias through the lower cooling assembly according to one or more embodiments shown and described herein.
Figure 4:
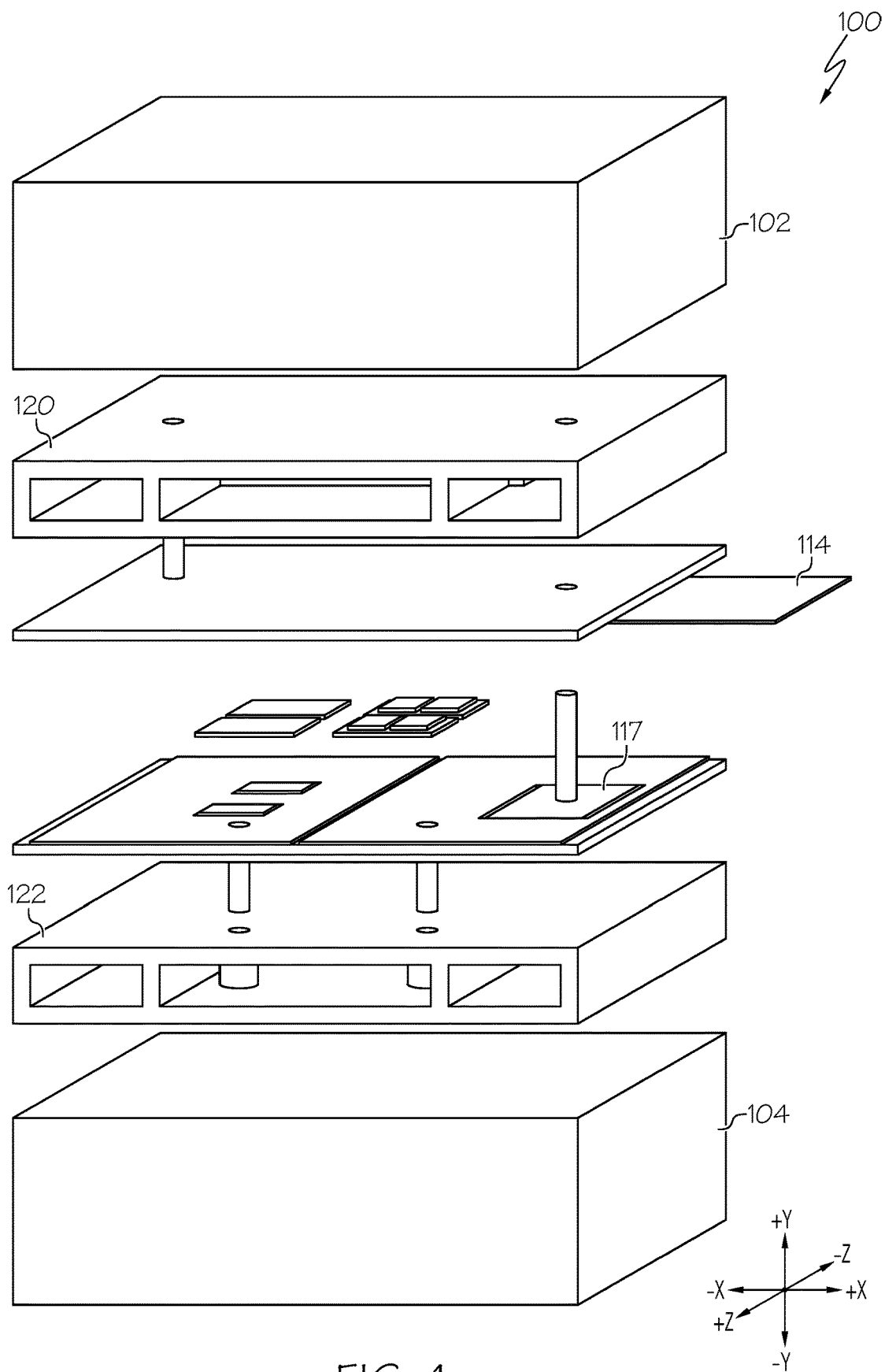
FIG. 4 depicts an upper and side perspective exploded view of the inverter of FIG. 1 including vias through the upper cooling assembly and vias through the lower cooling assembly according to one or more embodiments shown and described herein.

Turning to FIGS. 2-4 with reference to FIG. 1, various views of the inverter 100 are depicted. FIG. 2 depicts an exploded view of the inverter 100 including upper vias 124 and 126 formed through the upper cooling assembly 120 and lower vias 126 and 128 formed through the lower cooling assembly 122. FIG. 3 depicts a lower perspective exploded view of the inverter 100 including upper vias 124 and 126 formed through the upper cooling assembly 120 and lower vias 126 and 128 formed through the lower cooling assembly 122. FIG. 4 depicts an upper and side perspective exploded view of the inverter 100 including upper vias 124 and 126 formed through the upper cooling assembly 120 and lower vias 126 and 128 formed through the lower cooling assembly 122.

As depicted in FIG. 2, the upper cooling assembly 120 may include one or more chambers, such as fourth chamber 150, fifth chamber 154, and air or sixth chamber 152. The fourth chamber 150, fifth chamber 154, and sixth chamber 152 may be defined by one or more walls, such as inner wall 180, upper wall 181, inner wall 182, lower wall 183, outer wall 185, and outer wall 187. The upper cooling assembly 120 may include one or more via pathways, such as via pathway 134 and via pathway 136. The via pathway 134 and the via pathway 136 may provide a tunnel-like structure in which conductive upper via 124 and upper via 126 may be disposed. It is noted that the via pathway 134 and via pathway 136 may be formed through one or more of the fourth chamber 150, fifth chamber 154, and/or sixth chamber 152. Moreover, the upper cooling assembly 120 may include an appropriate number of vias that may include appropriate sizes, shapes, and dimensions. A metal inverse opal (MIO) or porous metal structure 192 may be disposed proximal or adjacent to at least part of the lower wall 183. For instance, porous metal structure 192 may include an MIO that includes a metal film containing an arrangement of interconnected spherical pores. The porous metal structure 192 may span the sixth chamber 152 and one or more of the fourth chamber 150 or fifth chamber 154. In embodiments, the porous metal structure 192 may allow for two-phase cooling to be applied to the power device unit 170. According to examples, single-phase cooling may be applied to the gate driver unit 102 as the gate driver unit 102 may generally produce less head than the power device unit 170. It is noted, however, that two-phase cooling may also be applied to the gate driver unit 102, such as with a porous metal structure (not shown) applied to the upper wall 181 or the like.

Additionally or alternatively, the lower cooling assembly 122 may include one or more chambers, such as first chamber 156, second chamber 159, and air or third chamber 158. The first chamber 156, second chamber 159, and third chamber 158 may be defined by one or more walls, such as inner wall 160, upper wall 161, inner wall 162, lower wall 163, outer wall 165, and outer wall 167. The lower cooling assembly 122 may include one or more via pathways, such as via pathway 138 and via pathway 140. The via pathway 138 and the via pathway 140 may provide a tunnel-like structure in which lower via 128 and lower via 130 may be disposed. It is noted that the via pathway 138 and via pathway 140 may be formed through one or more of the first chamber 156, second chamber 159, and/or third chamber 158. Moreover, the lower cooling assembly 122 may include an appropriate number of vias that may include appropriate sizes, shapes, and dimensions. A MIO or porous metal structure 192 may be disposed proximal or adjacent to at least part of the upper wall 161. The porous metal structure 192 may span the third chamber 158 and one or more of the second chamber 159 and/or the first chamber 156. In embodiments, the porous metal structure 192 may allow for two-phase cooling to be applied to the power device unit 170. According to examples, single-phase cooling may be applied to the capacitor unit 104 as the capacitor unit 104 may generally produce less head than the power device unit 170. Similar to the gate driver unit 102 described above, two-phase cooling may also be applied to the capacitor unit 104, such as with a porous metal structure (not shown) applied to the lower wall 163 or the like.

The porous metal structure 192 of the upper cooling assembly 120 and/or the lower cooling assembly 122 may include a material that defines a network of voids, pores, dimples or other formations that may provide an increased surface area for nucleation of a cooling liquid from a liquid to a gas (e.g., passive heat management). The network of voids or pores may also provide a structure through which a coolant fluid (e.g., liquid and/or gas) may flow to cool the porous layer and the power device unit 170 coupled thereto (e.g., active heat management). According to various aspects, the porous metal structure 192 may include a metal such as Copper (Cu), Nickel (Ni), and/or the like. It is noted that the porous metal structure 192 may be formed through a sintering process, through a MIO process (e.g., a copper inverse opal process (CIO), a nickel inverse opal (NIO) process, and/or the like), or the like.

As described herein, the capacitor unit 104 and the gate driver unit 102 may be electrically coupled to the power device unit 170 through one or more vias, such as upper via 124, upper via 126, lower via 128, and lower via 130. For instance, the capacitor unit 104 may be electrically coupled to one or more of the output busbar 114, input busbar 110 and input busbar 112 to which the power device unit 170 may be electronically coupled. In examples, the power device unit 170 may be soldered bonded directly to one or more of the output busbar 114, input busbar 110 and input busbar 112. In embodiments, the power device unit 170 may be electrically coupled to the gate driver unit 102 through one or more vias, such as upper via 124 and upper via 126. The power device unit 170 may include terminals or pads 172 (FIG. 3) that may be bonded (e.g., such as wire bonded) to gate terminal 115 (FIG. 3) and gate terminal 117 (FIG. 4) which may be electrically coupled to the upper via 124 and upper via 126, respectively. It is noted that other bonding methods may be utilized.

As described herein, the power device unit 170 may include one or more individual power devices, which may include one or more semiconductor devices such as, but not limited to, an IGBT, a reverse conducting IGBT (RC-IGBT), a metal-oxide-semiconductor field-effect transistor (MOSFET), a power MOSFET, a diode, a transistor, and/or combinations thereof. In some embodiments, at least one power device of a plurality of power devices of the power device unit 170 may include a wide-bandgap semiconductor, and may be formed from any suitable material such as, but not limited to, SiC, silicon dioxide ($SiO_2$), aluminum nitride (AlN), gallium nitride (GaN), and boron nitride (BN), and the like. In some embodiments, a plurality of power devices of the power device unit 170 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power device unit.

In embodiments, the inverter 100 may include one or more insulation layers that may electrically insulate the power device unit 170. For instance, embodiments may include an upper insulation layer 108 and/or a lower insulation layer 106. The upper insulation layer 108 may be disposed between the upper cooling assembly 120 and the power device unit 170, such as between the lower wall 183 of the upper cooling assembly 120 and the output busbar 114 of a substrate. The lower insulation layer 106 may be disposed between the lower cooling assembly 122 and the power device unit 170, such as between the upper wall 161 of the lower cooling assembly 122 and the input busbar 110 and/or input busbar 112 of a substrate. It is further noted that insulation layers may be provide in or through the via pathways 134, 136, 138, and/or 140.

The upper insulation layer 108 and/or a lower insulation layer 106 may include a dielectric layer that may provide a medium for thermal conduction, electrical insulation, or the like. In some embodiments, the upper insulation layer 108 and/or lower insulation layer 106 may include a ceramic that may be directly bonded to the substrate of busbars (e.g., the output busbar 114, input busbar 110 and/or input busbar 112), a substrate of the upper cooling assembly 120 and/or lower cooling assembly 122 (e.g., to an aluminum substrate of the upper cooling assembly 120 and/or lower cooling assembly 122), which may be similar to direct bonded copper (DBC) or direct bonded aluminum (DBA) substrates, or active metal braze (AMB) substrate. In an example, the upper insulation layer 108 and/or lower insulation layer 106 may include a ceramic dielectric layer (e.g., Alumina (Al2O3), Aluminum nitride (AlN), Beryllium oxide (BeO)), an insulated metal substrate (IMS) dielectric layer, or other dielectric layer. Accordingly, the upper insulation layer 108 and/or lower insulation layer 106 may electrically isolate the upper cooling assembly 120 and/or lower cooling assembly 122, however, in other embodiments, the substrate of busbars (e.g., the output busbar 114, input busbar 110 and/or input busbar 112) may be bonded to the upper cooling assembly 120 and/or lower cooling assembly 122 without the upper insulation layer 108 and/or lower insulation layer 106.

Figure 5:
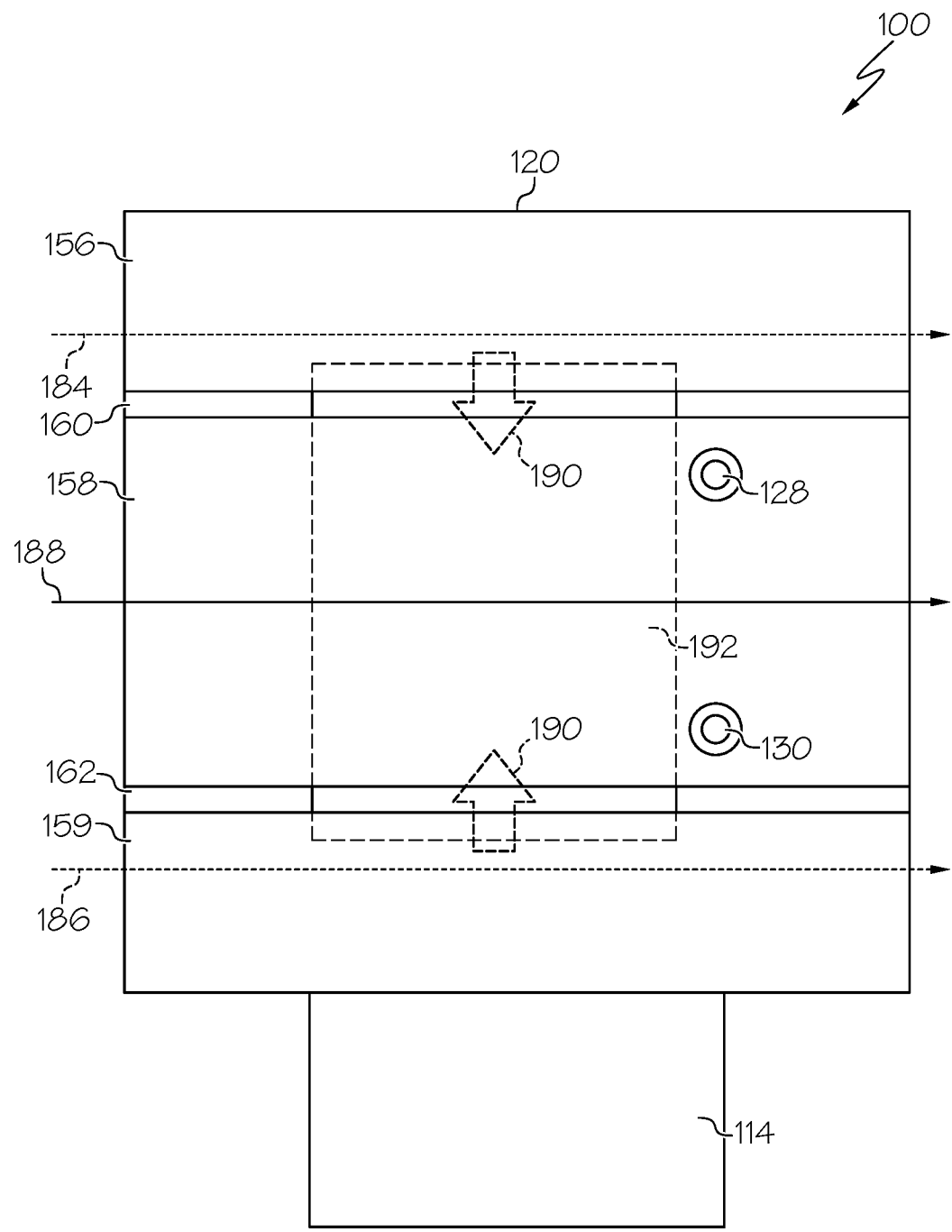
FIG. 5 depicts a partial cross-sectional view of a lower cooling assembly of the inverter of FIG. 1 including coolant fluid and vapor according to one or more embodiments shown and described herein.

Turning to FIG. 5, depicted is a partial cross-sectional view of the lower cooling assembly 122 of the inverter 100 including coolant fluid 184/186 and vapor 188. As described herein, the lower cooling assembly 122 may include a hybrid two-phase cooling assembly wherein single phase cooling may be applied to the capacitor unit 104 and two-phase cooling may be applied to the power device unit 170 from below. While the lower cooling assembly 122 is depicted in FIG. 5, it is noted that the upper cooling assembly 12 may include similar or the same functionality. For instance, the upper cooling assembly 120 may include a hybrid two-phase cooling assembly wherein single phase cooling may be applied to the gate driver unit 102 and two-phase cooling may be applied to the power device unit 170 from above.

In embodiments, coolant fluid 184 flows through first chamber 156, coolant fluid 186 flows through second chamber 159, and vapor 188 flows through the third chamber 158.

The flow of the coolant fluid 184, coolant fluid 186, and/or vapor 188 may allow for increased transfer of heat from the power device unit 170 and/or PCB substrates (See FIGS. 1-4). The porous metal structure 192 is disposed at the upper wall 161 proximal the power device unit 170 and may be disposed in the first chamber 156, second chamber 159, and third chamber 158. The power device unit 170 may generate heat that may be a significant amount of heat which could harm parts of the inverter 100. The heat may be a result of transistor switching, internal resistance, or the like. The head generate by the power device unit 170 is conducted through substrate of the PCB 101 (e.g., output busbar 114, input busbar 110, and input busbar 112 as shown in FIGS. 1-4). In traditional systems, the heat may be too great to allow for placement of the capacitor unit 104 and/or gate driver unit 102 close to or within the same packaging of the power device unit 170. As described above, disclosed embodiments may improve heat spreading and heat transfer such that the power device unit 170 may be placed in close proximity to the capacitor unit 104 and/or gate driver unit 102.

In operation, the coolant fluid 184 and coolant fluid 186 may be pumped through the first chamber 156 and the second chamber 159, respectively. At the lower wall 163 proximate the capacitor unit 104, the flow of the coolant fluid 184 and coolant fluid 186 transfer or dissipate heat from the capacitor unit 104. At the upper wall 161, the coolant fluid 184 and coolant fluid 186 disposed with the first chamber 156 and the second chamber 159 may be heated by the power device unit 170 and such that the coolant fluid 184 and coolant fluid 186 flowing through the porous metal structure 192 vaporizes and the vapor flows through the porous metal structure 192, as indicated by vapor flow paths 190. The vapor flow paths 190 allow for the vapor 188 to flow into the third chamber 158, which may include a condenser side of an enclosed chamber defined by the first chamber 156, the second chamber 159, and the third chamber 158.

Some embodiments of a third chamber 158 include an enclosed chamber made of copper or other thermally conductive material which has porous metal structure 192 sintered to the inner walls 162, 160 and upper wall 161 and may be charged with liquid. The inner walls 162, 160, upper wall 161 and/or lower wall 163 of the third chamber 158 may include copper, aluminum, silver, gold, or other thermally conductive material. Furthermore, the porous metal structure 192 may be sinter metal particles such as copper, aluminum, gold, silver, or other thermally conductive material. The charged liquid is heated at the evaporator side (e.g., first chamber 156 and/or second chamber 159) and becomes vapor as depicted by flow paths 190 and flows to the condenser side (e.g., third chamber 158).

It is noted that the lower cooling assembly 122 may include different numbers of chambers (e.g., two, four, etc.), chambers may include different fluids or vapors, and the like. For instance, porous metal structure 192 may be disposed through inner wall 162 and not inner wall 160, such that two phase cooling is applied through the inner wall 162 but not through inner wall 160. Other embodiments may include appropriate arrangements.

Figure 6:
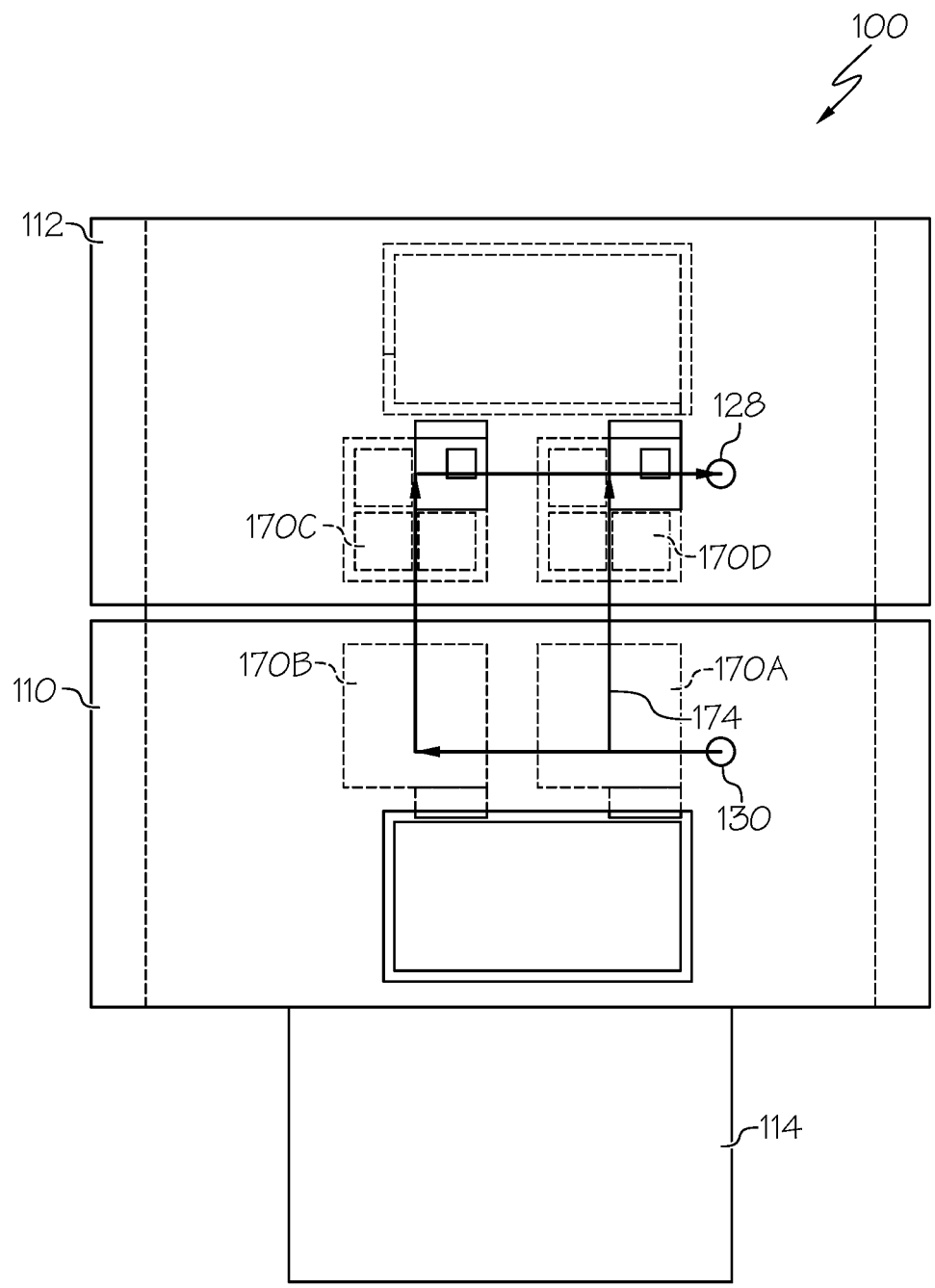
FIG. 6 depicts a partial and lower cross-sectional view of the inverter of FIG. 1 including current flow paths between vias and a power device according to one or more embodiments shown and described herein.

Referring now to FIG. 6, depicted is a partial and lower cross-sectional view of the power device unit 170 of the inverter 100 including current flow path 176 between lower vias 128, 130, and the power device unit 170. As illustrated, in operation, current may flow from via 130 through the power device unit 170, and to the lower via 128. The lower vias 128 and 130 may be electrically coupled to the capacitor unit 104 (FIG. 1-4) as described herein. The length of the current path may impact inductance within the circuit of the inverter 100. In some examples, the inverter 100 may provide between 70% and 90% reduction in inductance over traditional inverters, even though the capacitor unit 104 and gate driver unit 102 are integrated with the power device unit 170 of the inverter 100.

In embodiments, the inverter 100 may include one or more modules or power device units 170 (each having four adjacent MOSFETs arranged horizontally (e.g., arranged generally in a plane defined by the +X—-X axis and +Z—-Z axs) and disposed in a double-sided cooling structure comprising the upper cooling assembly 120 and the lower cooling assembly 122, using hybrid two-phase cooling technology. For instance, the power device unit 170 may include MOSFETs 170A, 170B, 170C, and 170D. Current may flow between the MOSFETs 170A, 170B, 170C, and 170D as indicated by the arrows showing the current path 174. It is noted that the distance between MOSFET 170B and 170C is greater than the distance between the MOSFET 170A and MOSFET 170B. Likewise, the distance between the MOSFET 170A and 170D may be greater than the distance between the MOSFETs 170C and 170D. Accordingly, the parallel circuits may be non-symmetrical. It is noted that some embodiments may include symmetrical parallel circuits (e.g., such as shown in FIGS. 9-12).

Figure 7:
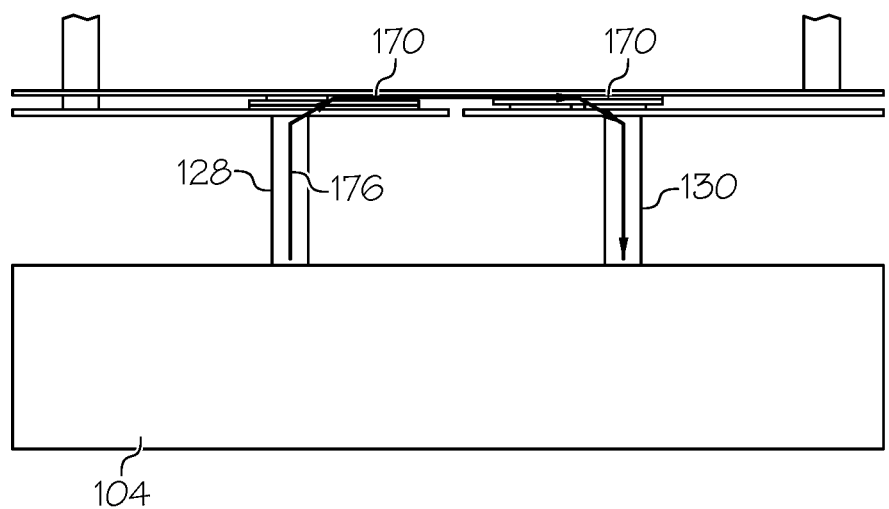
FIG. 7 depicts a partial and side cross-sectional view of the inverter of FIG. 1 including a power device unit, vias, a capacitor unit, and current flow paths through vias according to one or more embodiments shown and described herein.

Turning to FIG. 7, depicted is a partial and side cross-sectional view of the power device unit 170 of the inverter 100 including current flow path 176 between lower vias 128, 130, the power device unit 170, and the capacitor unit 104. Similar to FIG. 6, arrows indicate the current flow path 176 through the lower vias 128, 130 and the power device unit 170. Moreover, the capacitor unit 104 is electrically coupled to the power device unit 170 through the lower vias 128, 130 such that the capacitor unit 104 is in the current flow path 176. As described herein, the vias 128 and 130 may be disposed in via pathway 134 and the via pathways 138, 140 of the lower cooling assembly 122 (not shown in FIG. 7).

Figure 8:
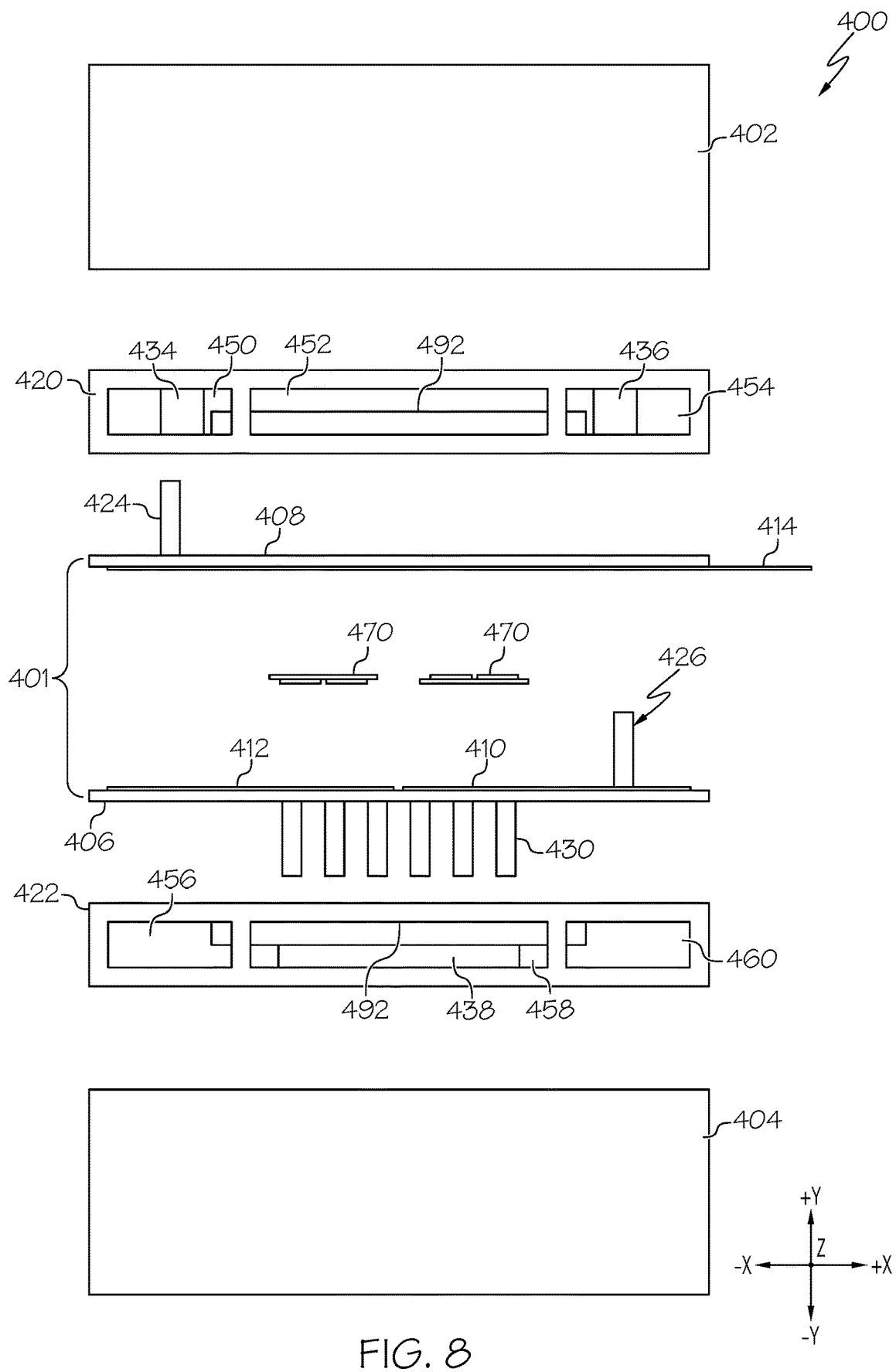
FIG. 8 depicts an exploded view of an inverter including a PCB disposed between an upper cooling assembly and a lower cooling assembly, and including vias through the upper cooling assembly and a plurality of vias through the lower cooling assembly according to one or more embodiments shown and described herein.

FIG. 8 depicts an exploded view of an inverter 400 including a PCB 401 disposed between an upper cooling assembly 420 and a lower cooling assembly 422, and including vias 424, 426 formed through the upper cooling assembly and a plurality of vias 430 through the lower cooling assembly 422. It is noted that liked named components of inverter 400 and inverter 100 (FIGS. 1-7) may include similar or the same functionality unless context suggests otherwise or warrants a particular distinction. The inverter 400 may include a gate driver unit 402, a capacitor unit 404, one or more output busbars 414, input busbar 410 (e.g., a positive busbar) and input busbar 412 (e.g., a negative busbar). Moreover, the inverter 400 may include an upper insulation layer 408 and a lower insulation layer 406. The upper insulation layer 408 may be disposed between the upper cooling assembly 420 and the power device unit 470 and/or the PCB 401 to which the power device unit 470 is coupled, and the lower insulation layer 406 may be disposed between the lower cooling assembly 422 and the power device unit 470 and/or the PCB 401 to which the power device unit 470 is coupled.

In embodiments, the inverter 400 may apply two-phase cooling to the power device unit 470 and single phase cooling to the gate driver unit 402 and the capacitor unit 404. For instance, the upper cooling assembly 420 and the lower cooling assembly 422 may each include an MIO or porous metal structure 492 disposed proximal or adjacent to the power device unit 470. As such, two-phase cooling may be applied to the power device unit 470 to dissipate heat therefrom. This may allow the inverter 400 to integrate the gate driver unit 402 and the capacitor unit 404 in the same package as the power device unit 470, and in close proximity thereto.

The upper cooling assembly 420 may include via pathway 434 and via pathway 436 may provide a tunnel-like structure in which conductive via 424 and via 426 may be disposed. It is noted that the via pathway 434 and via pathway 436 may be formed through one or more of a first chamber 450, second chamber 454, and/or third chamber 452 of the upper cooling assembly 420. Moreover, the via pathway 434 and the via pathway 436 may include insulators disposed therein.

The lower cooling assembly 422 may include one or more via pathways, such as via pathway 438. The plurality of conductive vias 430 may be disposed within the via pathway 438 to electrically coupled the power device unit 470 to the capacitor unit 404. In some embodiments, the plurality of conductive vias 430 may be electrically isolated from each other. Moreover, the plurality of conductive vias 430 may include an appropriate number of vias providing current from the power device unit 470 to the capacitor unit 404, and an appropriate number of vias providing current from the capacitor unit 404 to the power device unit 470. The number of vias providing current from the power device unit 470 to the capacitor unit 404 may be the same or a different number of vias providing current from the capacitor unit 404 to the power device unit 470. For instance, the plurality of vias 430 may include i number of vias providing current from the capacitor unit 404 to the power device unit 470, and j number of vias providing current from the power device unit 470 to the capacitor unit 404, where i and j are numbers (e.g., 1, 2, 3, 4, etc.).

Figure 9:
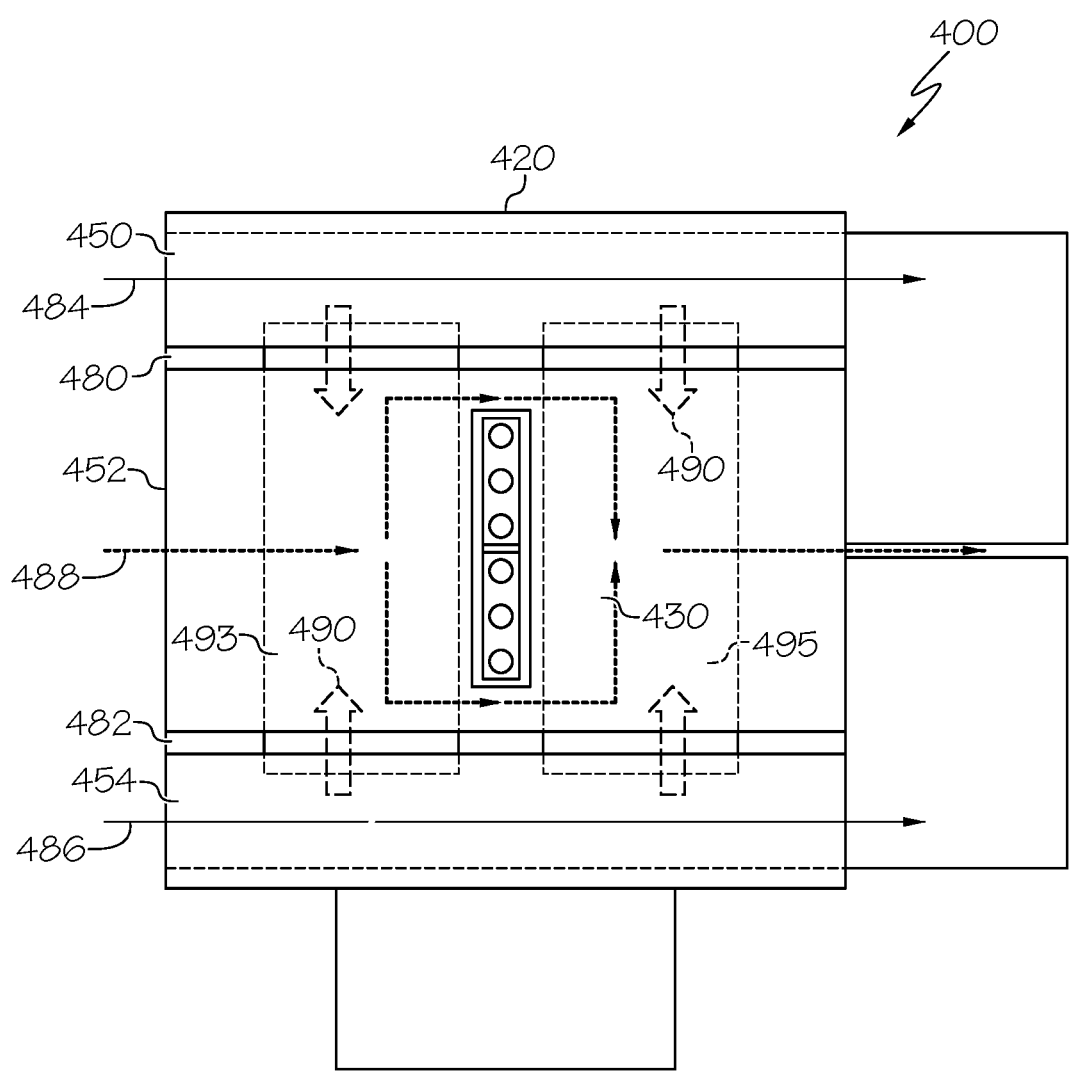
FIG. 9 depicts a partial cross-sectional view of a lower cooling assembly of the inverter of FIG. 8 including coolant fluid and vapor according to one or more embodiments shown and described herein.

Referring to FIG. 9, depicted is a partial cross-sectional view of the lower cooling assembly 422 of the inverter 400 including coolant fluid 486, coolant fluid 484, and vapor 488. The coolant fluid 486, coolant fluid 484, and vapor 488 may flow through first chamber 450, second chamber 452, and third chamber 454 respectively. In examples, the first chamber 450, second chamber 452, and third chamber 454 may include enclosed chambers. It is further noted that the lower cooling assembly 422 may include different numbers of chambers (e.g., two, four, etc.), chambers may include different fluids or vapors, and the like. While the lower cooling assembly 422 is depicted in FIG. 9, it is noted that the upper cooling assembly 420 may include similar or the same functionality. Moreover, the upper cooling assembly 420 may be similar or the same as upper cooling assembly 120 or may include a plurality of vias similar to the lower cooling assembly 422. In general, the upper cooling assembly 420 may include a hybrid two-phase cooling assembly wherein single phase cooling may be applied to the gate driver unit 402 and two-phase cooling may be applied to the power device unit 470 from above.

In embodiments, the lower cooling assembly 422 may include a porous metal structure 492 that may include one or more portions or sections of a porous metal medium. For instance, the porous metal structure 492 may include an upstream portion 493 and a downstream portion 495 of porous metal medium. The via pathway 438 is disposed between the upstream portion 493 and the downstream portion 495, such that the via pathway 438 is downstream of the upstream portion 493 and is upstream of the downstream portion 495. It is noted that the via pathway 438 may be disposed in other locations according to embodiments. In another example, the porous metal structure 492 may include different numbers of portions (e.g., 1, 3, 4, etc.).

The porous metal structure 492 may be formed through the inner walls 480 and 482 such that the porous metal structure 492 spans the first chamber 450, the third chamber 452, and the second chamber 454. As noted with reference to inverter 100 (See FIGS. 1-7), the porous metal structure 492 may be formed on a wall of the lower cooling assembly 422 that is adjacent to the power device unit 470, such as an upper wall. In the upper cooling assembly 420, the porous metal structure 492 may be formed on a bottom wall adjacent to the power device unit 470 (see FIG. 8).

As described herein, the porous metal structure 492 may allow heat from the power device unit 470 to vaporize the coolant fluid 484 and coolant fluid 486 disposed with the first chamber 450 and the second chamber 454 such that the coolant fluid 484 and coolant fluid 486 flowing through the porous metal structure 492 vaporizes and the vapor flows through the porous metal structure 492, as indicated by vapor flow paths 490. The vapor flow paths 490 allow for the vapor 488 to flow into the third chamber 452, which may include a condenser side of an enclosed chamber defined by the first chamber 450, the second chamber 454, and the third chamber 452.

It is noted that the path of the vapor 488 is indicated by arrows in the third chamber 452. The via pathway 438 may be positioned in the pathway such that the vapor 488 must flow around the via pathway 438. This may cool portions of the via pathway 438 but may also restrict some of the flow in the third chamber 452. In embodiments, the via pathway 438 may include angles, chamfers, or other formation that may reduce drag and/or increase the flow of vapor 488 within the third chamber 452.

Figure 10:
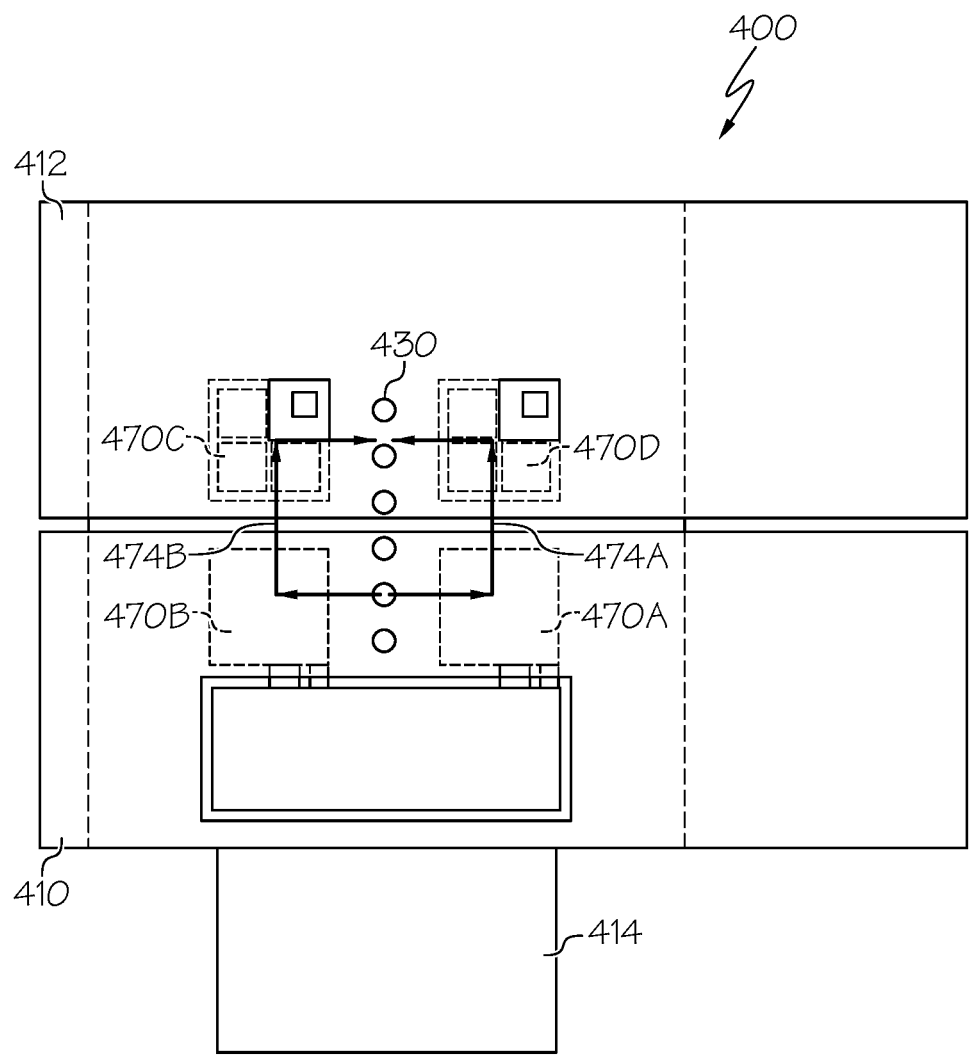
FIG. 10 depicts a partial and lower cross-sectional view of the inverter of FIG. 8 including current flow paths between vias and the power device unit according to one or more embodiments shown and described herein.

Turning to FIG. 10, depicted is a partial and lower cross-sectional view of the inverter 400 including current flow path 474A and current flow path 474B through the plurality of vias 430 and the power device unit 470. The plurality of vias 430 may be electrically coupled to the capacitor unit 404 (FIG. 9) as described herein. The length of the current path may impact inductance within the circuit of the inverter 400. In some examples, the inverter 400 may provide between 70% and 90% reduction in inductance over traditional inverters, even though the capacitor unit 404 and gate driver unit 402 are integrated with the power device unit 470 of the inductor 400.

In embodiments, the inverter 400 may include three modules or power device units 470 (each having four adjacent MOSFETs) arranged horizontally and disposed in a double-sided cooling structure comprising the upper cooling assembly 420 and the lower cooling assembly 422, using hybrid two-phase cooling technology. For instance, the power device unit 470 may include MOSFETs 470A, 470B, 470C, and 470D. Current may flow between the MOSFETs 470A, 470B, 470C, and 470D as indicated by the arrows showing the current path 474A and 474B. The current path 474A may flow from the plurality of vias 430 to the MOSFET 470A, to MOSFET 470D, and back to the plurality of vias 430. The current path 474B may flow from the plurality of vias 430 to the MOSFET 470B, to MOSFET 470C, and back to the plurality of vias 430. It is noted that the length of the current path 474A (e.g., the distance that the current must flow) between the plurality of vias 430, MOSFET 470A, MOSFET 470D and the plurality of vias 430 may be generally the same as the length of the current path 474B (e.g., the distance that the current must flow) between the plurality of vias 430, MOSFET 470B, MOSFET 470C and the plurality of vias 430. Accordingly, the parallel circuits may be symmetrical.

Figure 11:
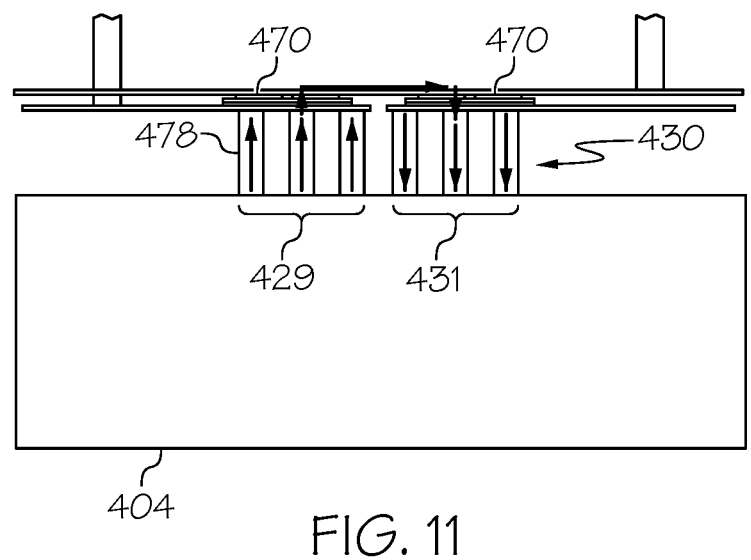
FIG. 11 depicts a partial and side cross-sectional view of the inverter of FIG. 8 including a power device unit, vias, a capacitor unit, and current flow paths through a plurality of vias according to one or more embodiments shown and described herein.

FIG. 11 depicts a partial and side cross-sectional view of the inverter 400 including the power device unit 470, plurality of vias 430, the capacitor unit 404, and current flow path 478 through the a plurality of vias 430. Similar to FIG. 10, arrows indicate the current flow path 478 through the plurality of vias 430, which may include a first plurality of vias 429 which direct current from the capacitor unit 404 to the power device unit 470 and a second plurality of vias 431 which direct current from the power device unit 470 to the capacitor unit 404. Moreover, the capacitor unit 404 is electrically coupled to the power device unit 470 through the first plurality of vias 429 and second first plurality of vias 431 such that the capacitor unit 404 is in the current flow path 478. As described herein, the first plurality of vias 429 and second first plurality of vias 431 may be disposed in via pathway 438 of the lower cooling assembly 422 (not shown in FIG. 7).

Figure 12:
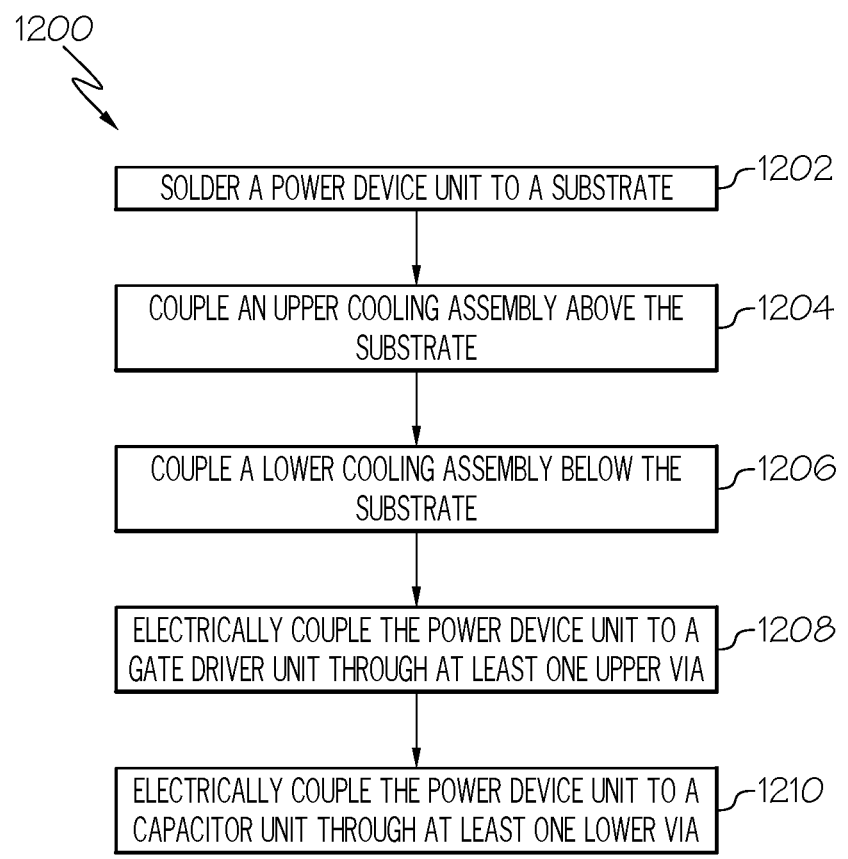
FIG. 12 depicts a flow diagram of an illustrative method of forming an integrated inverter according to one or more embodiments shown and described herein.

Turning to FIG. 12, a method 1200 of forming an illustrative integrated inverter (e.g., inverter 100, inverter 400, etc.) is depicted as a flow diagram. Accordingly, references may be made to components described with reference to the preceding figures. It should be understood that the order of the process described herein with respect to FIG. 12 is merely illustrative, and that the present disclosure is not limited to the order described herein. An illustrative example of a particular ordering will be described herein, but the present disclosure is not limited to such an example.

At block 1202, a power device unit is joined to a substrate. For instance, the power device unit 170 and/or 470 may be directly bonded to a PCB 101, 401. The power device unit may include one or more devices as described herein. The one or more devices may be directly bonded, soldered, or otherwise joined to input and output busbars of a substrate. In another aspect, the power device unit may be electrically connected to the substrate via wire bonding or other methods. According to some embodiments, the power device unit may be coupled to gate terminals of a substrate and/or gate driver unit (e.g., gate driver unit 102 and/or 402. It is further noted that the substrate may be formed by laminating one or more layers of substrate, etching out a predetermined pattern corresponding to the size and shape of one or more power devices.

At block 1204, the upper cooling assembly may be coupled in the +Y direction of the +Y—−Y axis (e.g., above relative FIGS. 1-4, 8, etc.) the substrate of a PCB. In an example, the upper cooling assembly 120 and/or 420 may be coupled above the PCB 101 and/or 401. In some embodiments, one or more insulation layers (e.g., upper insulation layer 108 and/or upper insulation layer 408), which may include a dielectric layer, may be formed above or as part of the substrate of a PCB. In some embodiments, the upper insulation layer may be directly bonded to the substrate of the PCB (e.g., the output busbar 114 and/or 414, input busbar 110 and/or 410, input busbar 112 and/or 412, etc.), a substrate of an upper cooling assembly (e.g., to an aluminum substrate of the upper cooling assembly 120 and/or 420), which may be similar to DBC or direct DBA substrates, or AMB substrates. In other embodiments, the substrate of a PCB may be bonded to the upper cooling assembly without the upper insulation layer.

At block 1206, the lower cooling assembly may be coupled in the −Y direction of the +Y—−Y axis (e.g., below relative FIGS. 1-4, 8, etc.) the substrate of a PCB. In an example, the lower cooling assembly 122 and/or 422 may be coupled above the PCB 101 and/or 401. In some embodiments, one or more insulation layers (e.g., lower insulation layer 106 and/or upper insulation layer 406), may be formed in the −Y direction of the +Y—−Y axis (e.g., below) or as part of the substrate of a PCB. In some embodiments, the lower insulation layer may be directly bonded to the substrate of the PCB (e.g., the output busbar 114 and/or 414, input busbar 110 and/or 410, input busbar 112 and/or 412, etc.), a substrate of a lower cooling assembly (e.g., to an aluminum substrate of the lower cooling assembly 122 and/or 422), which may be similar to DBC or direct DBA substrates, or AMB substrates. In other embodiments, the substrate of a PCB may be bonded to the lower cooling assembly without the upper insulation layer.

At block 1208, the power device unit may be electrically coupled to a gate driver unit through at least one upper via. At block 1210, the power device unit may be electrically coupled to the capacitor unit through at least one lower via. Electrically coupled the power device unit to the gate driver unit (e.g., gate driver unit 102 and/or 402) and/or capacitor unit (e.g., capacitor unit 104 and/or 404) may include bonding terminals or pads of the power device unit to appropriate vias, gate terminals, or the like. In an embodiment, the power device unit may be electrically coupled to the capacitor unit through at least one lower via such that parallel circuits may be formed between power devices of the power device unit and the capacitor units. According to examples, the parallel circuits may be symmetrical or non-symmetrical.

It should now be understood that the present disclosure describes designs for an integrate inverter that includes a power device coupled to a substrate. The substrate is disposed between an upper cooling assembly and lower cooling assembly such that the upper cooling assembly is thermally coupled to an upper side of the substrate and the lower cooling assembly is thermally coupled to a lower side of the substrate. A gate driver unit is coupled to the upper cooling assembly, wherein at least one upper via formed through the upper cooling assembly electrically couples the gate driver to the power device and a capacitor unit coupled to the lower cooling assembly, wherein at least one lower via formed through the lower cooling assembly electrically couples the capacitor unit to the power device. These designs decrease the distance between active and passive devices, reduce inductance, and manage thermal output of the inverter.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system, comprising:
    a power device unit coupled to a substrate;
    an upper cooling assembly thermally coupled to an upper side of the substrate;
    a lower cooling assembly thermally coupled to a lower side of the substrate, the upper cooling assembly and the lower cooling assembly comprising an enclosed chamber, each having a wall contacting the upper and lower sides of the substrate, the wall being lined with a porous metal inverse opal disposed thereon that allows for two phase cooling to be applied on the power device unit;
    a gate driver unit coupled to the upper cooling assembly, at least one upper via formed through the upper cooling assembly electrically coupling the gate driver unit to the power device unit; and
    a capacitor unit coupled to the lower cooling assembly, at least one lower via formed through the lower cooling assembly electrically coupling the capacitor unit to the power device unit.

2. The system of claim 1, wherein the power device unit comprises one or more MOSFETs.

3. The system of claim 2, wherein the substrate includes input and output busbars, and wherein the one or more MOSFETs are directly bonded to the input and output busbars.

4. The system of claim 3, wherein the capacitor unit is electrically coupled to the input and output busbars through the at least one lower via.

5. The system of claim 2, wherein the one or more MOSFETs are arranged horizontally.

6. The system of claim 1, wherein the gate driver unit is electrically coupled to gate terminals of the substrate via the at least one upper via.

7. The system of claim 1, wherein:
    a liquid is disposed within the enclosed chamber of the upper cooling assembly, wherein heat generated by the power device unit vaporizes the liquid into a vapor within the enclosed chamber of the upper cooling assembly on an evaporator side and the vapor flows through the porous metal inverse opal disposed on the wall to a condenser side of the enclosed chamber of the upper cooling assembly.

8. The system of claim 1, wherein the porous metal inverse opal is further disposed on a lower side of the upper cooling assembly that is closest to the substrate.

9. The system of claim 1, wherein:
    a liquid is disposed within the enclosed chamber of the lower cooling assembly, wherein heat generated by the power device unit vaporizes the liquid into vapor within the enclosed chamber of the lower cooling assembly on an evaporator side and the vapor flows through the porous metal inverse opal disposed on the wall to a condenser side of the enclosed chamber of the lower cooling assembly.

10. The system of claim 1, wherein the porous metal inverse opal is further disposed on an upper side of the lower cooling assembly that is closest to the substrate.

11. The system of claim 1, further comprising:
    an upper insulation layer disposed between the upper cooling assembly and the upper side of the substrate.

12. The system of claim 11, further comprising:
    a lower insulation layer disposed between the lower cooling assembly and the lower side of the substrate.

13. The system of claim 12, wherein the upper insulation layer and the lower insulation layer comprise at least one of a ceramic dielectric layer or an insulated metal substrate (IMS) dielectric layer.

14. The system of claim 1, wherein the power device unit includes a three phase inverter circuit.

15. A method, comprising:
    soldering a power device unit to a substrate;
    coupling an upper cooling assembly above the substrate, the upper cooling assembly including at least one upper via and an enclosed chamber having a wall contacting the substrate, the wall being lined with a porous metal inverse opal disposed thereon that allows for two phase cooling to be applied on the power device unit;

coupling a lower cooling assembly below the substrate, the lower cooling assembly including at least one lower via and an enclosed chamber having a wall contacting the substrate, the wall being lined with a porous metal inverse opal disposed thereon that allows for two phase cooling to be applied on the power device unit;

electrically coupling the power device unit to a gate driver unit through the at least one upper via;

electrically coupling the power device unit to a capacitor unit through the at least one lower via.

16. The method of claim 15, wherein soldering the power device unit to the substrate comprises:

directly bonding a plurality of power devices to input and output busbars of the substrate.

17. The method of claim 15, further comprising:

forming an upper insulation layer between the upper cooling assembly and an upper side of the substrate; and forming a lower insulation layer between the lower cooling assembly and a lower side of the substrate.

18. A system, comprising:

a power device unit coupled to a substrate;

an upper cooling assembly thermally coupled to an upper side of the substrate and comprising at least one via pathway and at least one upper via disposed within the at least one via pathway of the upper cooling assembly;

a lower cooling assembly thermally coupled to a lower side of the substrate and comprising at least one via pathway and a plurality of lower vias disposed within the at least one via pathway of the lower cooling assembly, wherein the upper cooling assembly and the lower cooling assembly further comprise an enclosed chamber, each having a wall contacting the upper and lower sides of the substrate, the wall being lined with a porous metal inverse opal disposed thereon that allows for two phase cooling to be applied on the power device unit;

a gate driver unit coupled to the upper cooling assembly and electrically coupled to the power device unit by the at least one upper via; and a capacitor unit coupled to the lower cooling assembly and electrically coupled to the power device unit by the plurality of lower vias.

19. The system of claim 18, wherein the plurality of lower vias are disposed a determined distance between the capacitor unit and busbars of the substrate.

20. The system of claim 19, wherein the power device unit comprises a plurality of MOSFETs arranged in parallel circuits, such that current flow paths between the busbars and each of the parallel circuits are equal in length.

* * * * *

UNITED STATES PATENT AND TRADEMARK OFFICE
CERTIFICATE OF CORRECTION

| | | |
|---|---|---|
| PATENT NO. | : 11,778,793 B2 | Page 1 of 1 |
| APPLICATION NO. | : 17/218897 | |
| DATED | : October 3, 2023 | |
| INVENTOR(S) | : Hitoshi Fujioka and Shailesh N. Joshi | |

It is certified that error appears in the above-identified patent and that said Letters Patent is hereby corrected as shown below:

In the Specification

In Column 6, Line(s) 64, delete "SiO2" and insert --SiO$_2$--, therefor.

In Column 7, Line(s) 23, delete "provide" and insert --provided--, therefor.

In Column 7, Line(s) 40, delete "Al2O3" and insert --Al$_2$O$_3$--, therefor.

In Column 8, Line(s) 11, delete "generate" and insert --generated--, therefor.

In Column 9, Line(s) 11, delete "axs" and insert --axis--, therefor.

In Column 10, Line(s) 16, delete "coupled" and insert --couple--, therefor.

In Column 12, Line(s) 4, before "plurality", delete "a".

In Column 13, Line(s) 29, delete "integrate" and insert --integrated--, therefor.

In the Claims

In Column 16, Line(s) 19, Claim 19, after "disposed", insert --at--.

Signed and Sealed this
Fifth Day of December, 2023

*Katherine Kelly Vidal*
Katherine Kelly Vidal
*Director of the United States Patent and Trademark Office*